(12) United States Patent
Giridhar et al.

(10) Patent No.: US 10,217,494 B2
(45) Date of Patent: Feb. 26, 2019

(54) GLOBAL BIT LINE PRE-CHARGING AND DATA LATCHING IN MULTI-BANKED MEMORIES USING A DELAYED RESET LATCH

(71) Applicant: Apple Inc., Cupertino, CA (US)

(72) Inventors: Bharan Giridhar, Fremont, CA (US); Sachmanik Cheema, Sunnyvale, CA (US); Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 15/635,825

(22) Filed: Jun. 28, 2017

(65) Prior Publication Data

US 2019/0005993 A1    Jan. 3, 2019

(51) Int. Cl.
*G11C 7/10* (2006.01)
*G11C 7/12* (2006.01)
*G11C 8/12* (2006.01)

(52) U.S. Cl.
CPC . *G11C 7/12* (2013.01); *G11C 8/12* (2013.01)

(58) Field of Classification Search
CPC ........................................................ G11C 7/12
See application file for complete search history.

(56) References Cited

U.S. PATENT DOCUMENTS

| | | | | |
|---|---|---|---|---|
| 5,404,338 A | * | 4/1995 | Murai | G11C 7/1072 365/189.05 |
| 5,774,409 A | * | 6/1998 | Yamazaki | G06F 12/0215 365/230.03 |
| 5,831,924 A | * | 11/1998 | Nitta | G11C 7/18 365/189.17 |
| 5,956,285 A | * | 9/1999 | Watanabe | G11C 8/16 365/196 |
| 5,959,930 A | * | 9/1999 | Sakurai | G11C 8/12 365/230.03 |
| 6,009,501 A | * | 12/1999 | Manning | G11C 5/063 365/189.02 |
| 6,091,629 A | * | 7/2000 | Osada | G06F 12/0802 365/154 |

(Continued)

OTHER PUBLICATIONS

Goa ("Shift Registers", Griffith University, Lecture/ teachings slides, https://maxwell.ict.griffith.edu.au/yg/teaching/dns/dns_module3_p3.pdf, 2011)*

*Primary Examiner* — Anthan Tran
*Assistant Examiner* — Mushfique Siddique
(74) *Attorney, Agent, or Firm* — Meyertons, Hood, Kivlin, Kowert & Goetzel, P.C.

(57) ABSTRACT

A memory that includes multiple banks, each of which include multiple data storage cells, is disclosed. A decoder circuit may be configured to receive and decode information indicative of an address, and select a particular bank based on the decoded information. A first latch circuit coupled to a particular global bit line, which is, in turn, coupled to the particular bank, may generate multiple local clock signals using the decoded information and store data based on a voltage level of the particular global bit line using the plurality of local clock signals. Other circuits may also pre-charge the particular global bit line using a particular local clock signal of the plurality of local clock signals.

15 Claims, 9 Drawing Sheets

(56) References Cited

U.S. PATENT DOCUMENTS

| | | | | |
|---|---|---|---|---|
| 6,166,993 | A * | 12/2000 | Yamauchi | G11C 7/1072 365/194 |
| 6,212,109 | B1 * | 4/2001 | Proebsting | G11C 7/065 257/E21.659 |
| 6,275,430 | B1 * | 8/2001 | Ka | G11C 7/1048 365/189.05 |
| 6,301,187 | B1 * | 10/2001 | Ooishi | G11C 5/025 365/230.03 |
| 6,321,316 | B1 * | 11/2001 | Manning | G11C 5/063 365/230.03 |
| 6,351,427 | B1 * | 2/2002 | Brown | G11C 7/1006 365/189.05 |
| 6,381,191 | B2 * | 4/2002 | Ooishi | G11C 7/10 365/189.05 |
| 6,462,998 | B1 * | 10/2002 | Proebsting | G11C 7/04 257/E21.659 |
| 6,822,497 | B1 * | 11/2004 | Yao | G06F 1/04 327/291 |
| 6,928,026 | B2 * | 8/2005 | Anvar | G06F 13/4086 365/233.16 |
| 7,286,423 | B2 | 10/2007 | Ramaraju | |
| 7,916,570 | B2 * | 3/2011 | Ware | G11C 5/14 365/230.03 |
| 8,379,478 | B2 * | 2/2013 | Anvar | G06F 13/4086 365/233.1 |
| 9,236,100 | B1 * | 1/2016 | Hess | G11C 7/1051 |
| 9,412,469 | B1 * | 8/2016 | Seningen | G11C 29/04 |
| 9,529,533 | B1 * | 12/2016 | Dreesen | G06F 1/3296 |
| 9,786,360 | B2 * | 10/2017 | Koike | G11C 7/12 |
| 2001/0002882 | A1 * | 6/2001 | Shimazaki | G11C 7/18 365/51 |
| 2001/0008498 | A1 * | 7/2001 | Ooishi | G11C 7/10 365/230.03 |
| 2001/0028581 | A1 * | 10/2001 | Yanagisawa | G11C 5/025 365/189.05 |
| 2002/0125538 | A1 | 9/2002 | Abedifard | |
| 2002/0176307 | A1 * | 11/2002 | Jung | G11C 8/12 365/230.03 |
| 2003/0179644 | A1 * | 9/2003 | Anvar | G06F 13/4086 365/233.1 |
| 2004/0004900 | A1 * | 1/2004 | Dosaka | G11C 7/1072 365/230.06 |
| 2004/0136228 | A1 | 7/2004 | Campardo | |
| 2006/0126418 | A1 * | 6/2006 | Mochida | G11C 11/4076 365/230.03 |
| 2006/0176730 | A1 * | 8/2006 | Chan | G11C 7/12 365/154 |
| 2007/0028060 | A1 * | 2/2007 | Ware | G11C 5/14 711/154 |
| 2008/0025113 | A1 * | 1/2008 | Kitagawa | G11C 7/067 365/189.09 |
| 2008/0140974 | A1 * | 6/2008 | Ware | G11C 5/14 711/167 |
| 2010/0157699 | A1 * | 6/2010 | Gupta | G11C 7/18 365/189.16 |
| 2010/0214857 | A1 * | 8/2010 | Hsu | G11C 7/1042 365/191 |
| 2010/0260002 | A1 * | 10/2010 | Chen | G11C 8/12 365/207 |
| 2011/0205820 | A1 * | 8/2011 | Takayama | G11C 11/4091 365/200 |
| 2011/0261614 | A1 * | 10/2011 | Tsukada | G11C 13/0004 365/163 |
| 2011/0280092 | A1 * | 11/2011 | Rao | G11C 29/26 365/201 |
| 2012/0051160 | A1 * | 3/2012 | Tao | G11C 29/50012 365/191 |
| 2013/0088926 | A1 * | 4/2013 | Tao | G11C 11/419 365/189.05 |
| 2013/0141988 | A1 * | 6/2013 | McCombs | G11C 7/1051 365/189.05 |
| 2014/0177354 | A1 * | 6/2014 | Gupta | G11C 7/00 365/189.15 |
| 2014/0198594 | A1 * | 7/2014 | McCombs | G11C 7/12 365/203 |
| 2014/0321217 | A1 * | 10/2014 | Song | G11C 7/12 365/189.02 |
| 2015/0071016 | A1 * | 3/2015 | Tao | G11C 11/419 365/191 |
| 2015/0121030 | A1 * | 4/2015 | Lin | G11C 11/419 711/170 |
| 2015/0227456 | A1 * | 8/2015 | Bhatia | G06F 1/3203 711/154 |
| 2015/0269995 | A1 | 9/2015 | Kajigaya | |
| 2015/0348600 | A1 * | 12/2015 | Bhatia | G11C 5/147 365/189.16 |
| 2016/0240231 | A1 * | 8/2016 | Arvapalli | G11C 7/065 |
| 2016/0267963 | A1 * | 9/2016 | Koike | G11C 7/12 |
| 2016/0358637 | A1 * | 12/2016 | Bu | G11C 8/16 |
| 2017/0285998 | A1 * | 10/2017 | Mathuria | G06F 3/0613 |
| 2017/0315737 | A1 * | 11/2017 | Kajigaya | G06F 3/0616 |

\* cited by examiner

GLOBAL BIT LINE PRE-CHARGING AND DATA LATCHING IN MULTI-BANKED MEMORIES USING A DELAYED RESET LATCH

BACKGROUND

Technical Field

Embodiments described herein relate to integrated circuits, and more particularly, to techniques for operating multi-bank memories.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc.

Such mobile devices may include multiple integrated circuits, each performing different tasks. In some cases, circuits that perform different tasks may be integrated into a single integrated forming a system on a chip (SoC). For example, an SoC may include one or more processors or processor cores designed to execute program instructions, as well as multiple memory circuits (or simply "memories").

Memories may be employed in numerous functions within an SoC. For example, some memories may be used to store frequently used program instructions retrieved from main memory. Such memories are commonly referred to as cache memories. To manage performance and power consumption, the data storage cells in many memories may be partitioned into multiple banks. Each bank may be activated independent of the other banks based on address information included in a memory operation.

SUMMARY

Various embodiments of a memory including multiple banks, each bank including multiple data storage cells, are disclosed. A circuit may be configured to receive information indicative of a control signal, and select a particular bank of the multiple banks based upon the control signal. The particular bank may be configured to discharge a particular global bit line coupled to the particular bank based upon data stored in a given data storage cell included in the particular bank. A first latch circuit coupled to a particular global bit line and to another global bit line coupled to another bank of the multiple banks may be configured to generate a plurality of local clock signals based upon the decoded address, and store read data based on a voltage level of the particular global bit line using the plurality of local clock signals. The first latch circuit may be further configured to pre-charge the particular global bit line using a particular local clock signal of the plurality of local clock signals.

In one embodiment, wherein the memory further includes a second latch circuit. The second latch circuit may be configured to store an output of the first latch circuit using a clock signal.

In a further embodiment, the first latch circuit is further configured to generate a reset signal based upon at least one local clock signal of the plurality of local clock signals. The reset signal may be delayed from the at least one local clock signal.

BRIEF DESCRIPTION OF THE DRAWINGS

The following detailed description makes reference to the accompanying drawings, which are now briefly described.

Figure 1:
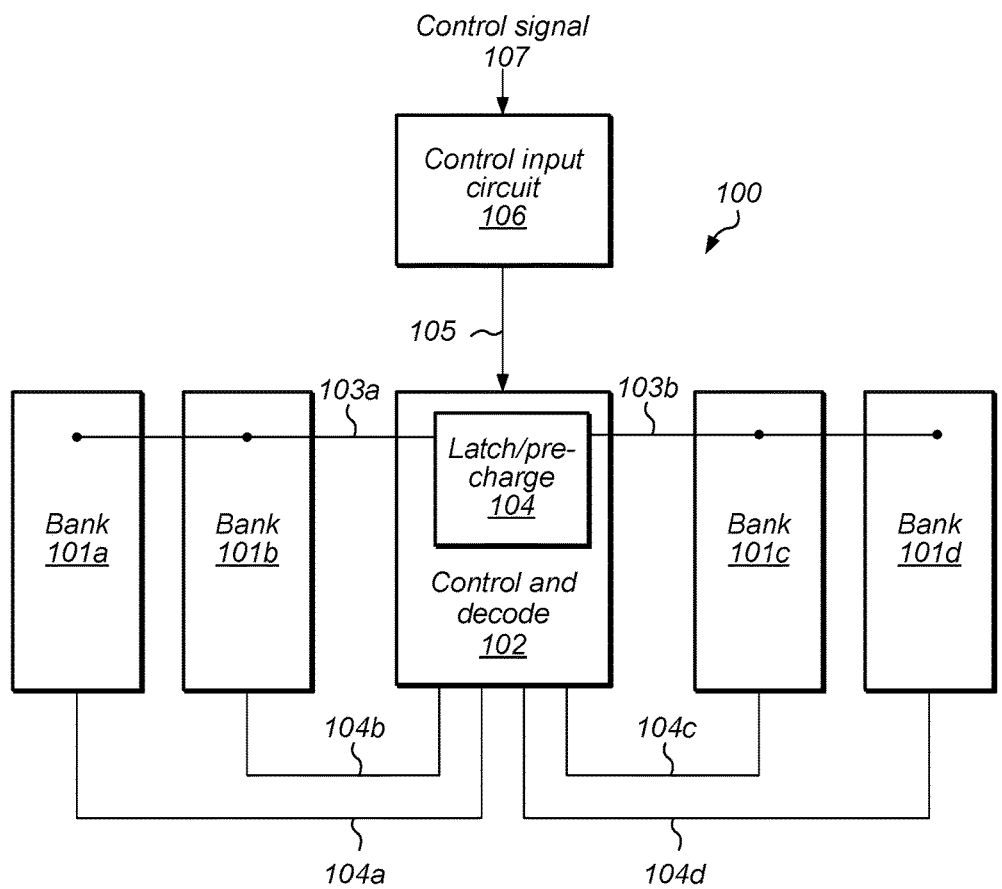
FIG. 1 illustrates an embodiment of a multi-bank memory.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Computing systems may employ memories in various capacities. For example, in some computing systems a memory may used to store program instructions for execution by a processor or processor core. In other computing systems, a memory may be used to store operands used in arithmetic or logic operations, or other suitable data to be processed by the processor or processor core.

Depending on the application and desired performance, memories may be designed according to different design styles. For example, in some computing systems, a memory may include multiple banks, each of which may include multiple data storage cells. Such banks may be coupled together using global bit lines allowing data to be transferred to and from individual banks from shared input/output (I/O) circuits. As used and described herein a global bit line is a signal line in a memory, on which data may be transferred to or from a particular bank or multiple banks included in the memory.

When employing multiple banks with associated global bit lines, pre-charge circuits may be used to charge the global bit lines to a target voltage level prior to a read or write operation on the memory. With the large number of pre-charge circuits in such a multi-bank memory, large driver circuits may be employed to generate the signals to activate and deactivate the pre-charge circuits. Such large driver circuits may contribute to increased power consumption.

During read operations, data transferred on global bit lines may be captured using latch circuits that hold the data when the global bit lines are pre-charged to a subsequent cycle. Such latches may be reset at the start of cycle, which can, in some cases, lead to a race condition between the reset of a latch and the hold time for a downstream latch to capture the stored data. The embodiments illustrated in the drawings and described below may provide techniques for generating pre-charge signals while minimizing the impact on power consumption, and delaying the reset of a latch coupled to a global bit line to avoid race conditions with downstream latches.

A block diagram depicting an embodiment of a memory is illustrated in FIG. 1. In the illustrated embodiment, multi-bank memory 100 includes banks 101a-d, control input circuit 106, control and decode circuit 102, and latch and pre-charge circuit 104.

Control input circuit 106 may be configured to receive control signal 107. In various embodiments, control signal 107 may include pre-decoded or raw address information. In cases where control signal 107 include raw address information indicative of an address corresponding to a particular storage location in bank 101a-d, control input circuit 106 may decode the address to generate a decoded address, which is transmitted to control and decode circuit 102 via bus 105. In cases where control signal 107 includes pre-decoded address information, control input circuit 106 may buffer control signal 107 and transmit the buffered version of control signal 107 to control and decode circuit 102 via bus 105. In various embodiments, control input circuit 106 may include any suitable combination of logic circuits and/or latch and flip-flop circuits.

Control and decode circuit 102 may be configured process information received on bus 105. Upon receiving information from control input circuit 106 via bus 105, control and decode circuit 102 may used the received information generate bank enable signals 104a-d, which may select a corresponding one of banks 101a-d. As used and described herein, a bank enable signal is a signal generated by the decoding of information indicative of an address that is used to select a bank of a multi-bank memory for access. It is noted that in some embodiments, additional decoded address data may be sent to banks 101a-d, but is not depicted in the embodiment of FIG. 1 for the sake of clarity.

Each of banks 101a-d may include multiple data storage cells arranged in rows and columns. The data storage cells may, in various embodiments, include dynamic storage cells, static storage cells, non-volatile storage cells, or any other suitable type of storage cells. A column of data storage cells may be coupled to a common local bit line (not shown). Each data storage cell within a column may be coupled to a respective word line that may be used to select and activate the corresponding data storage cell.

A particular bit line included in banks 101a-d may be coupled to a sense circuit (not shown) which may be configured to sense and amplify a voltage level on the particular bit line resulting from activation of a data storage cell coupled to the particular bit line. The sense circuit may transfer the amplified voltage from the particular bit line to one of global bit lines 103a or 103b. In the illustrated embodiment, global bit line 103a is shared between banks 101a and 101b, while global bit line 103b is shared between banks 101c and 101d.

Each of global bit lines 103a and 103b is coupled to latch and pre-charge circuit 104 included in control and decode circuit 102. As described below in more detail, latch and pre-charge circuit 104 may pre-charge global bit lines 103a and 103b, which may then be discharged by a sense amplifier or other circuit within banks 101a-d. Latch and pre-charge circuit 104 may additionally be configured to store a voltage state of one of global bit lines 103a and 103b. This process is commonly referred to as "latching." As used and described herein pre-charging refers to charging or discharging a particular circuit node to a desired value prior to an evaluation operation of the circuit.

As described below in more detail, the pre-charge signals associated with only one of global bit lines 103a and 103b may toggled, i.e., transitioned to disable pre-charge during a read phase, and enable pre-charge during a pre-charge phase included in particular access cycle of multi-bank memory 100. The pre-charge signals associated with other global bit lines may be left in a state to keep the other global bit lines in pre-charge. Which global bit line is pre-charged may be based on a value of an address provided with an access command provided to multi-bank memory 100, and decoded by control and decode circuit 102. By selectively toggling the pre-charge signals, multi-bank memory 100 may, in various embodiment, conserve power associated with toggling of the pre-charge control clocks.

It is noted that the embodiment depicted in FIG. 1 is merely an example. In other embodiments, different circuit blocks, and different arrangements of circuit blocks may be employed.

Figure 2:
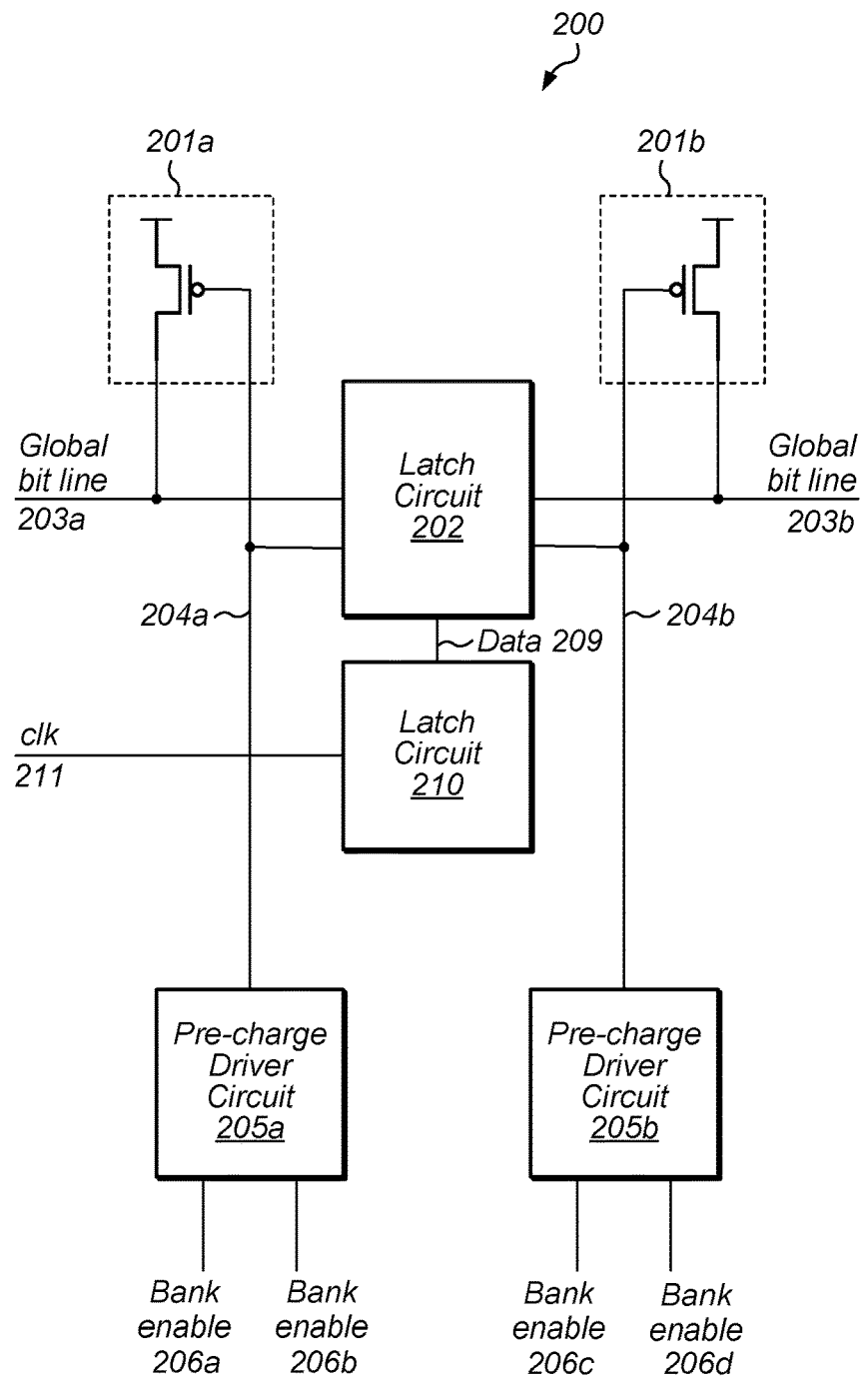
FIG. 2 illustrates a block diagram of an embodiment of global bit lines in an multi-bank memory.

Turning to FIG. 2, an embodiment of a latch and pre-charge circuit is illustrated. In various embodiments, latch and pre-charge circuit 200 may correspond to latch and pre-charge circuit 104 as depicted in the embodiment of FIG. 1. In the illustrated embodiment, latch and pre-charge circuit 200 includes latch circuits 202 and 210, pre-charge devices 201a and 201b, and pre-charge driver circuits 205a and 205b.

Latch circuit 202, as well as pre-charge devices 201a and 201b are coupled to global bit lines 203a and 203b. In various embodiments, global bit lines 203a and 203b may correspond to global bit lines 103a and 103b as depicted in the embodiment of FIG. 1.

Pre-charge devices 201a and 201b are controlled by pre-charge signals 204a and 204b, respectively. In various embodiments, pre-charge devices 201a and 201b may include one or more p-channel metal-oxide semiconductor field-effect transistors (MOSFETs) or any other suitable transconductance device.

Pre-charge signals 204a and 204b are generated by pre-charge driver circuits 205a and 205b, respectively. As described below in more detail, pre-charge signals 204a and 204b may be based on bank enable signals, such as, bank enable signals 206a-d, for example. By generating pre-charge signals 204a and 204b using bank enable signals, only pre-charge signals associated with an active bank may be activated, thereby saving power, in some embodiments.

As described below in more detail, latch circuit 202 may be configured to latch data from either of global bit lines 203a and 203b, depending on which of the global bit lines contains data. For example, if a bank associated with global bit line 203a is active, then data sensed from the bank will be transferred to global bit line 203a and then latched by latch circuit 202, while global bit line 203b remains inactive. In some embodiments, latch circuit 202 may use pre-charge signals 204a and 204b when latching data from either global bit line 203a or global bit line 203b. It is noted that although latch circuit 202 is depicted as being coupled to only two global bit lines, in other embodiments, latch circuit 202 may be coupled to any suitable number of global bit lines.

Latch circuit 202 is configured to output latched data on signal data 209, which is, in turn, latched by latch circuit 210 in response to an assertion of clk 211. As described below in more detail, latch circuit 202 may employ a delayed reset signal to hold off reset thereby allowing for adequate hold time of data present on signal data 209 so that it may be properly captured by latch circuit 210.

Latch circuit 210 may be designed according to one of various design methods. For example, latch circuit 210 may employ a dynamic latch circuit, a static latch circuit, or any other suitable circuit configured to sample and hold input data in response to an assertion of a clock or other timing signal. In some embodiments, latch circuit 210 may include multiple latches configured as a flip-flop circuit.

Figure 3:
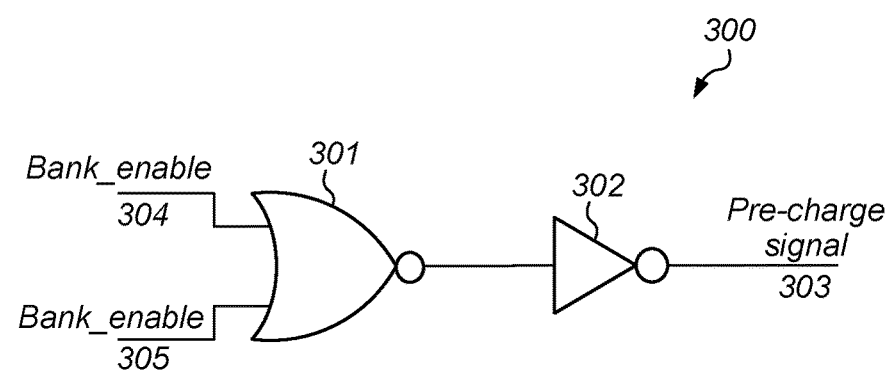
FIG. 3 illustrates a block diagram of an embodiment of a pre-charge signal generator circuit.

It is noted that the embodiment depicted in FIG. 2 is merely an example. In other embodiments, different circuit blocks and different arrangements of circuit blocks are possible and contemplated A block diagram of an embodiment of a pre-charge signal driver circuit is depicted in FIG. 3. In various embodiments, pre-charge signal driver circuit 300 may correspond to either of pre-charge driver circuits 205a or 205a as depicted in the embodiment of FIG. 2. Pre-charge signal driver circuit 300 includes NOR gate 301 and inverter 302.

The inputs of NOR gate 301 are coupled to bank_enable 304 and bank_enable 305. In various embodiments, bank_enable 304 and bank_enable 305 may correspond to bank_enable 206A and bank_enable 206B, or bank_enable 207A and bank_enable 207B, respectively. The output of NOR gate 301 is coupled to the input of inverter 302, the output of which is coupled to pre-charge signal 303. In some embodiments, pre-charge signal 303 may correspond to either of pre-charge signals 204a or 204b.

During operation, a particular one of bank_enable 304 and bank_enable 305 may be asserted. In some embodiments, the assertion of such a signal may include a transition from a low logic level to a high logic level. As used and described herein, a low or low logic level refers to a voltage level at or near ground potential, and a high or high logic levels refers to a voltage sufficiently large to turn on an n-channel Metal-Oxide Semiconductor Field-Effect Transistor (MOSFET) and turn off a p-channel MOSFET. In other embodiments, different technologies may result in different voltage levels for high and low logic levels. In response to the assertion of either of bank_enable 304 or bank_enable 305, pre-charge signal 303 may transition to a high logic value.

It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Static NOR gates, such as those shown and described herein may be implemented according to several design styles. Each NOR gate may consist of multiple other logic gates or any suitable combination of metal-oxide semiconductor field-effect transistors (MOSFETs) arranged to implement the desired NOR logic function.

Although a single NOR gate and a single inverter are depicted in the embodiment of FIG. 3, in other embodiments, different logic gates, and different arrangements of logic gates may be employed to generate pre-charge signal 303.

Figure 4:
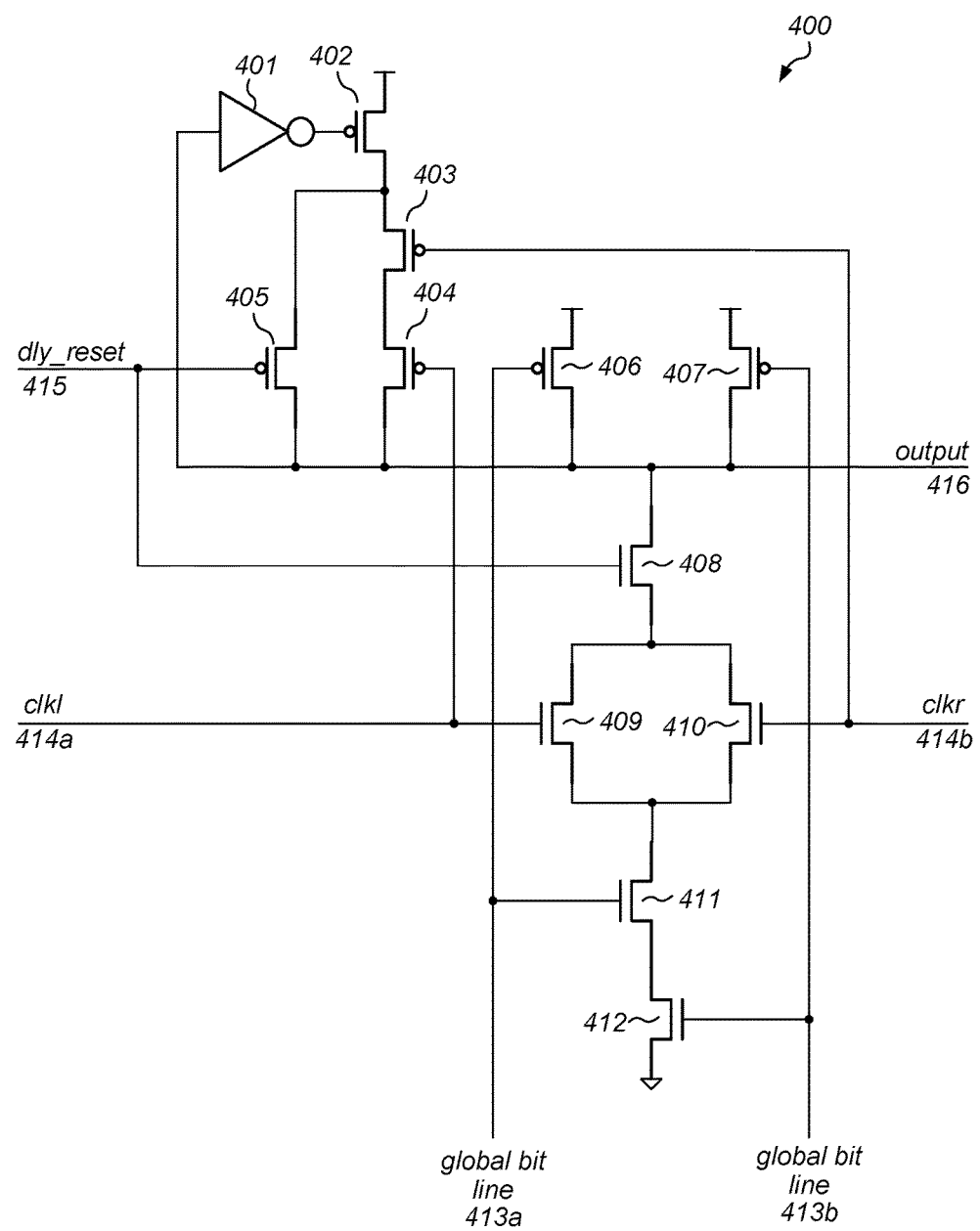
FIG. 4 illustrates a block diagram of an embodiment of a zero keeping latch.

Although many different types of latches may be employed in a memory, a particular type of latch (commonly referred to as a "zero keeper" or "zkeeper") may be used to sense and capture data on a global bit line. A particular embodiment of a zero keeper latch is illustrated in the diagram of FIG. 4. In various embodiments, latch 400 may correspond to latch circuit 202 as illustrated in the embodiment of FIG. 2.

In the illustrated embodiment, latch 400 includes devices 406 and 407 coupled to output 416 and controlled by global bit lines 413a, and 413b, respectively. It is noted that devices 406 and 407 may, in various embodiments, include one or more p-channel MOSFETs. Output 416 is further coupled to device 408, which is controlled by dly_reset 415. In some embodiments, device 408 may correspond to an n-channel MOSFET.

Device 408 is coupled to devices 409 and 410, which are controlled by clkl 414a and clkr 414b, respectively. In various embodiments, clkl 414a and clkr 414b may correspond to pre-charge signals 204a and 204b, respectively, as depicted in the embodiment of FIG. 2. In some embodiments, devices 409 and 410 may correspond to n-channel MOSFETs.

Devices 409 and 410 are further coupled to the serially coupled devices 411 and 412. Device 411 is controlled by global bit line 413a, and device 412 is controlled by global bit line 413b. In some embodiments, devices 409 and 410 may include one or more n-channel MOSFETs.

Output 416 is also coupled to the input of inverter 401, whose output controls device 402, which is coupled to a power supply and the serially coupled devices 403 and 404, thereby providing a possible conduction path to output 416. Device 403 is controlled by clkr 414b, and device 404 is controlled by clkl 414a. Device 403 is additionally coupled to device 405, which is controlled by dly_reset 415. In various embodiments, devices 402-405 may include one or more p-channel MOSFETs.

During operation, at the beginning of an access cycle, output 416 is reset to a voltage level at or near ground in response to dly_reset 415 being asserted activating device 408. Depending on which bank is active, one of clkl 414a or clkr 414b will be at a high logic level, activating a corresponding one of devices 409 and 410. At the beginning of the access cycle, global bit lines 413a and 413b are precharged to a high logic level, thereby activating devices 411 and 412, and providing a complete path to ground from output 416 allowing output 416 to be discharged to ground.

As the access cycle proceeds, dly_reset 415 will be de-asserted, deactivating device 408, preventing further discharge of output 416. Depending on the data sensed in the active bank, one of global bit lines 413a-b may be discharged to ground. When the discharge of one the global bit lines occurs, a corresponding one of devices 406 or 407 will activate and charge output 416 to the voltage level of the power supply. It is noted that in some cases neither of global bit lines 414a-b will discharge, and the state of output 416 will remain unchanged.

As the voltage level on output 416 increases, the output of inverter 401 transitions from a high logic level to a low logic level, activating device 402. Since the low logic level on dly_reset 415 has activated device 405, output 416 is further charged to the voltage level of the power supply via a conduction path between devices 402 and 405.

As the access cycle ends, the active one of clkl 414a or clkr 414b will return to a low logic level, thereby activating devices 403 and 404. Once devices 403 and 404 have been activated, output 416 is further charged to the voltage level of the power supply through a conduction path formed by devices 402, 403, and 404. The voltage level of output 416 will remain at a high logic level until the start of a subsequent access cycle, at which point, latch 400 will be reset according to the above description. Since the voltage level of output 416 is maintained, output 416 is commonly referred to as a storage node of latch 400.

It is noted that the embodiment depicted in the diagram of FIG. 4 is merely an example. In other embodiments, different devices and different arrangements of devices may be employed.

Figure 5:
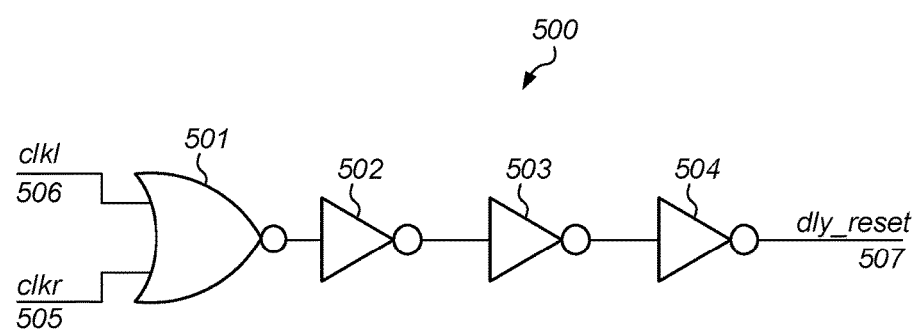
FIG. 5 illustrates an embodiment of a delayed reset circuit.

Turning to FIG. 5, an embodiment of a delayed reset circuit is illustrated. In various embodiments, delayed reset circuit 500 may employed in conjunction with a latch circuit, such as, latch circuit 400, for example. In the illustrated embodiment, delayed reset circuit 500 includes NOR gate 501, and inverters 502 through 504.

Signals clkl 506 and clkr 505 are coupled to the inputs of NOR gate 501. In various embodiments, signals clkl 506 and clkr 505 may correspond to signals clkl 414a and clkr 414b as depicted in the embodiment illustrated in FIG. 4. During operation, NOR gate 501 may perform a logical-NOR operation on the logic values present on signals clkl 506 and clkr 505, and generate an output signal, which is coupled to the input of inverter 502.

Inverter 502 may then invert the logical sense of the output of NOR gate 501 and to generate a signal coupled to the input of inverter 503. In a similar fashion, inverters 503 and 504 generate respective inverted signal, culminating in the generation of signal dly_reset 507. In various embodiments, signal dly_reset 507 may correspond to signal dly_reset 415 as illustrated in the embodiment of FIG. 4.

It is noted that the embodiment depicted in FIG. 5 is merely an example. In other embodiments, different logic gates, and different and arrangements of logic gates are possible and contemplated.

Figure 6:
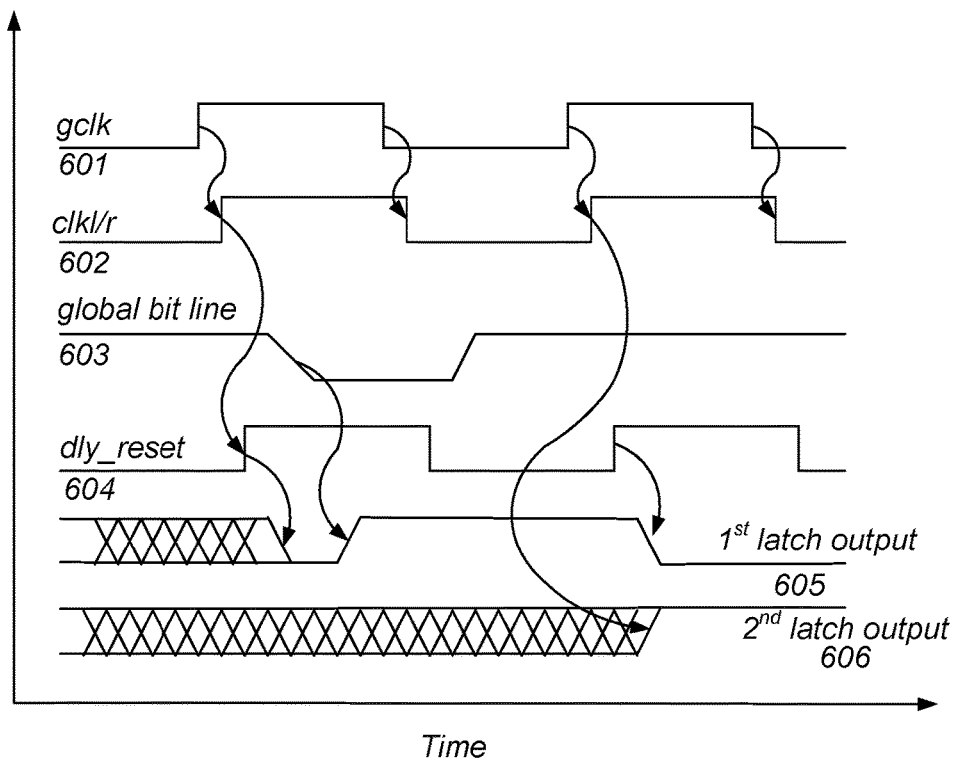
FIG. 6 illustrates an embodiment of waveforms associated with the operation of a zero keeping latch.

Turning to FIG. 6, an embodiment of waveforms resulting from the operation of a memory including a zero keeping latch is illustrated. In some embodiments, the waveforms may correspond to the operation of the embodiment of FIG. 2.

In various embodiments, gclk 601 may correspond to clk 211 as depicted in FIG. 2. In response to a rising edge of gclk 601, clkl/r 602 may assert. It is noted that clkl/r 602 may correspond to either of pre-charge signals 204a-b depending on the state of bank enable signals 206a-d.

Further in response to the rising edge of gclk 601, a particular bank, such as one of banks 101a-d, may be activated, resulting in the sensing of data store in a particular data storage cell included in the activated bank. Depending on the sensed data, global bit line 603 may discharge after having been pre-charged to a particular voltage level.

In response to the assert of clkl/r 604, a delayed reset circuit, such as delayed reset circuit 500 as depicted in FIG. 5, may assert dly_reset 604. As described above in regard to FIG. 4, reset of the latch sensing and capturing data from the global bit line is held off until dly_reset 604. As depicted in FIG. 6, $1^{st}$ latch output 605 is reset to a low logic level in respond to dly_reset 604 being asserted. It is noted that $1^{st}$ latch output 605 may, in some embodiments, correspond to data 209 as illustrated in FIG. 2. Prior to the reset, $1^{st}$ latch output 605 is in a logic "don't care" state, where either logic state is acceptable.

When the level of global bit line 603 reaches a sufficiently low voltage level, $1^{st}$ latch output 605 transitions to a high logic level capturing the state of global bit line 603. As described above, the captured data is held on $1^{st}$ latch output 605 until the beginning of the subsequent access cycle initiated by the second rising edge of gclk 601. The second rising edge of gclk 601, via clkl/r 602, triggers a second rising edge of dly_reset which, in turn, resets $1^{st}$ latch output 605. Before the reset of $1^{st}$ latch output 605, $2^{nd}$ latch output 606, captures the data from $1^{st}$ latch output 605 using clkl/r 602. In various embodiments, $2^{nd}$ latch output 606 may correspond to an output of latch circuit 210. It is noted that while $2^{nd}$ latch output 606 is depicted as being dependent upon clkl/r 602, in other embodiments, any suitable clock signal whose rising edge timing allows a latch, such as, e.g., latch circuit 210, to meet design specification setup and hold times may be employed.

It is noted that the waveforms depicted in FIG. 6 are merely examples, depicting a particular combination of sensed data and timing, for the purposes of illustration. In other embodiments, the waveforms may have different shapes and different relative timing between the various waveforms.

Figure 7:
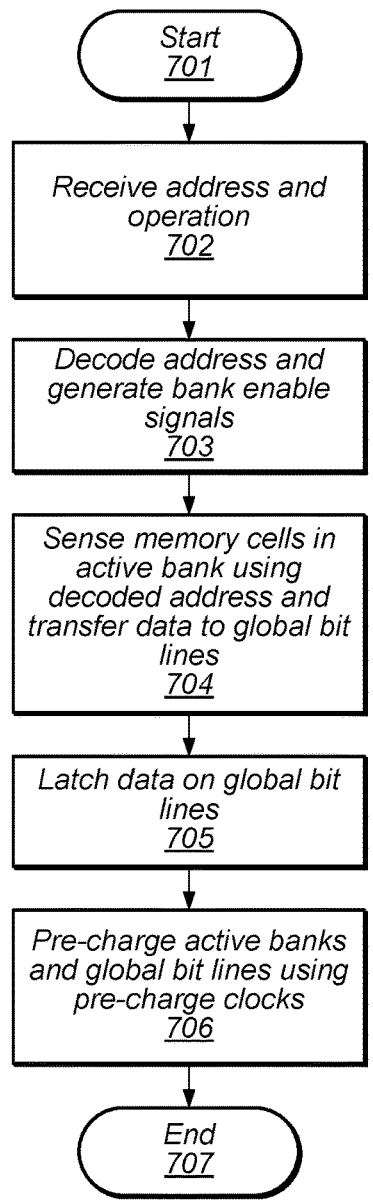
FIG. 7 illustrates a flow diagram depicting an embodiment of a method for operating a multi-bank memory.

Turning to FIG. 7, a flow diagram depicting an embodiment of a method for operating a multi-bank memory is illustrated. Referring collectively the embodiment of FIG. 1 and the flow diagram of FIG. 7, the method begins in block 701.

An address and operation may then be received by multi-bank memory 100 (block 702). In various embodiments, the operation may include either a read operation or a write operation at a location within multi-bank memory 100 specified by the address. In the case of a write operation, data to be stored at the location may also be received by multi-bank memory 100.

The received address may then be decoded and bank enable signals, such as, e.g., bank enable signals 206A-B may be generated using the decoded address (block 703). In some embodiments, the bank enable signals may also be based on a clock signal received by multi-bank memory 100.

Using the decoded address, data stored in one or more memory cells included in a particular bank of multi-bank memory 100 may then be sensed and the data transferred to global bit lines coupled between the different banks (block 704). In some embodiments, data from a particular memory cells may be differentially encoded prior to being sensed, while in other embodiments, the data may be single-ended. After the sensing operation, has been performed, resultant data may be transferred to one or more global bit lines in a single-ended fashion.

The data present on the global bit lines of multi-bank memory 100 may then be latched (block 705). In some embodiments, a latch circuit, such as, e.g., latch circuit 202, may perform a logical OR operation between two different global bit lines. As described below in more detail, the latch circuit may include a separate reset function based on one or more pre-charge signals.

Once the data on the global bit lines has been latch, the latch may be isolated from the global bit lines, the active banks of multi-bank memory 100, along with the global bit lines, may be pre-charged (block 706). Banks active during the sense operation are pre-charged to prepare for a new access cycle, while inactive banks have remained in a pre-charge state. By activating the pre-charge signals associated with the active banks while leaving other pre-charge signals inactive, switching power may be reduced in various embodiments. Once the active banks have been pre-charged, the operation may conclude in block 707.

It is noted that the embodiment of the method depicted in the flow diagram of FIG. 7 is merely an example. In other embodiments, different operations and different orders of operations may be employed.

Figure 8:
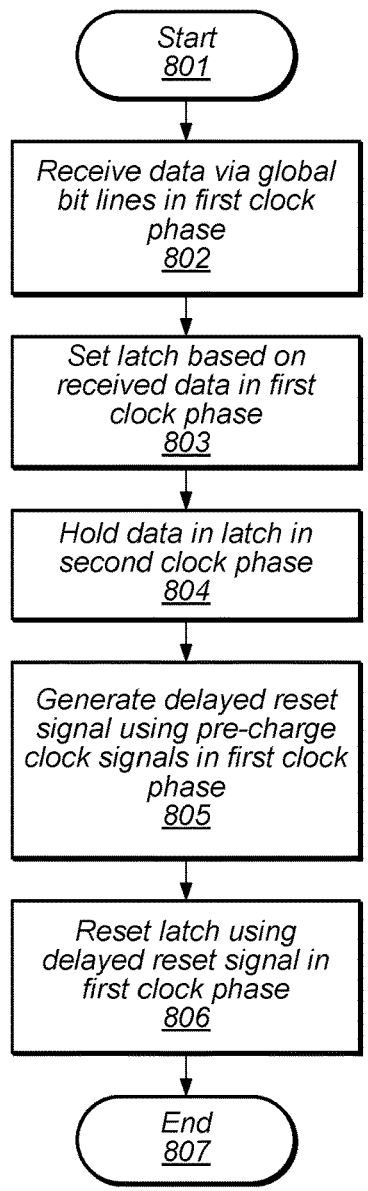
FIG. 8 illustrates a flow diagram depicting an embodiment of a method for latching data from global bit lines in a multi-bank memory.

Turning to FIG. 8, a flow diagram depicting an embodiment of a method for latching data received via global bit lines is illustrated. In various embodiments, the method depicted in the flow diagram of FIG. 8 may correspond to block 705 of the flow diagram illustrated in FIG. 7. Referring collectively to the embodiment of FIG. 4 and the flow diagram of FIG. 8, the method begins in block 801.

Data may then be received via global bit lines 413a-b during a first clock phase (block 802). In some embodiments, global bit lines 413a-b may be pre-charged to a voltage level substantially the same as that of the power supply, via pre-charge devices, such as, pre-charge devices 201a-b, for example. Once one of the pre-charge signals, such as, e.g., pre-charge signals 204a-b, transition to a high logic level, one of global bit lines 413a-b may be discharged based upon data sensed from a memory cell in a previously activated bank of a multi-bank memory, such as, multi-bank memory 100, for example.

The received data may then set latch 400 during the first clock phase (block 803). In various embodiments, output 416 of latch 400 may be initialized to a low logic level. When a particular one of global bit lines 413a-b is discharged, then device 406 will be activated sourcing current to output 416, causing a voltage level of output 416 to increase. In some cases, neither of global bit lines 413a-b will discharge, preventing either of devices 406 and 407 from activating, thereby maintaining the low logic level on output 416.

The data may then be held in latch 400 during a second clock phase (block 804). In the case when output 416 is charged to a voltage level substantially the same as the voltage level of the power supply, inverter 401 translates the high logic level on output 416 to a low logic level, thereby enabling device 402. During this point in time, dly_reset 415 is at a low logic level, activating device 405, providing a path for current to flow from the power supply output 416, maintaining the high logic level. As used and described herein, a clock phase is a particular period of time corresponding to when a clock signal is at a particular logic or voltage level. For example, in various embodiments, the first clock phase may correspond to a high logic level on gclk 601, and the second clock phase may correspond to a low logic level on gclk 601.

As previously mentioned, at the beginning of the method, one of the pre-charge signals were asserted to halt the pre-charge of a global bit line associated with the active bank. In response to the assertion of one of the pre-charge signals, a delayed reset signal may then be generated during the first clock phase (block 805). As described above in regard to FIG. 5, an assertion of either of clkl 414a or clkr 414b will result in the assertion of dly_reset 415 after a particular time period. In various embodiments, the time period may be selected based on a hold time specified for another latch coupled to output 416 of latch 400. The particular time period may be generated using one or more gate delays, or any other suitable delay generation method.

When dly_reset is asserted, device 408 may be activated, allowing a path for output 416 to discharge to ground, thereby resetting latch 400 during the first clock phase (block 806). In various embodiments, signals clkl 414a and clkr 414b, as well as global bit lines 413a-b are at a high logic level in order to allow for the reset of latch 400. By resetting latch 400 in such a fashion as described above, data store in latch 400 is maintained for a longer period of time, allowing a downstream latch, such as, e.g., latch circuit 210, to capture (or store) the output of latch 400 with adequate hold margin. The method may then conclude in block 807.

Although the operations in the embodiment of the method illustrated in FIG. 8 are depicted as being performed in a sequential fashion, in other embodiments, one or more of the operations may be performed in parallel.

Figure 9:
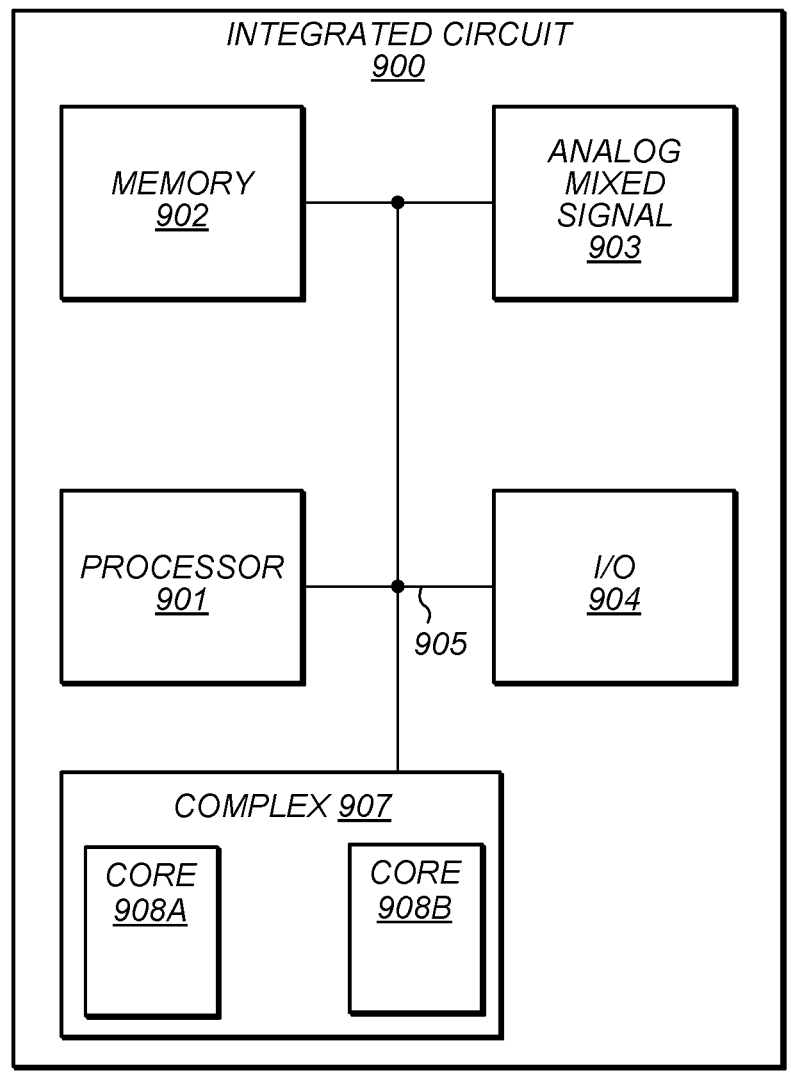
FIG. 9 depicts a block diagram of an embodiment of an integrated circuit.

A block diagram of an integrated circuit including multiple functional units is illustrated in FIG. 9. In the illustrated embodiment, the integrated circuit 900 includes a processor 901, and a processor complex (or simply a "complex") 907 coupled to memory block 902, and analog/mixed-signal block 903, and I/O block 904 through internal bus 905. In various embodiments, integrated circuit 900 may be configured for use in a desktop computer, server, or in a mobile computing application such as, e.g., a tablet or laptop computer.

Processor 901 may, in various embodiments, be representative of a general-purpose processor that performs computational operations. For example, processor 901 may be a central processing unit (CPU) such as a microprocessor, a microcontroller, an application-specific integrated circuit (ASIC), or a field-programmable gate array (FPGA).

Complex 907 includes processor cores 908A and 908B. Each of processor cores 908A and 908B may be representative of a general-purpose processor configured to execute software instructions in order to perform one or more computational operations. Processor cores 908A and 908B may be designed in accordance with one of various design styles. For example, processor cores 908A and 908B may be implemented as an ASIC, FPGA, or any other suitable processor design.

Memory block 902 may correspond to multi-bank memory 100 as illustrated in FIG. 1, In various embodiments, memory block 902 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 9, a single memory block is depicted. In other embodiments, any suitable number of memory blocks may be employed.

Analog/mixed-signal block 903 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 903 may be configured to perform power management tasks with the inclusion of on-chip power supplies and voltage regulators. Analog/mixed-signal block 903 may also include, in some embodiments, radio frequency (RF) circuits that may be configured for operation with wireless networks.

I/O block 904 may be configured to coordinate data transfer between integrated circuit 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 904 may be configured to implement a version of Universal Serial Bus (USB) protocol or IEEE 1394 (Firewire®) protocol.

I/O block 904 may also be configured to coordinate data transfer between integrated circuit 900 and one or more devices (e.g., other computing systems or integrated circuits) coupled to integrated circuit 900 via a network. In one embodiment, I/O block 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 904 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A memory, comprising:
   a plurality of banks, wherein each bank of the plurality of banks includes a plurality of data storage cells, wherein a particular bank of the plurality of banks is configured to discharge a particular global bit line of a plurality of global bit lines in response to a memory operation;
   a control circuitry configured to:
      receive information indicative of a control signal; and
      select a first bank of the plurality of banks based upon the control signal; and
      generate a plurality of bank enable signals using the control signal; and
   a first latch circuit coupled to the first bank via a first global bit line of the plurality of global bit lines, and a second bank via a second global bit line of the plurality of global bit lines, wherein the first latch circuit is configured to:
      store data based on a voltage level of the first global bit line;
      pre-charge the first global bit line based upon the control signal;
      generate a plurality of pre-charge signals using the plurality of bank enable signals; and
      generate a reset signal based upon at least one pre-charge signal of the plurality of pre-charge signals, wherein the reset signal is delayed from the at least one pre-charge signal.

2. The memory of claim 1, wherein the memory further comprises a second latch circuit configured to store an output of the first latch circuit using a clock signal.

3. The memory of claim 1, wherein the first latch circuit is further configured to reset using the reset signal.

4. The memory of claim 1, wherein the memory further comprises one or more p-channel metal-oxide semiconductor field-effects transistors (MOSFETs) coupled to the particular global bit line, and wherein to pre-charge the particular global bit line, the memory is further configured to activate the one or more p-channel MOSFETs.

5. A method, comprising:
   receiving, by a multi-bank memory, data indicative of an address location in the multi-bank memory;
   decoding the data indicative of the address location to generate a decoded address;
   generating a plurality of pre-charge signals using the decoded address;
   initiating a read operation of a particular bank of a plurality of banks included in the multi-bank memory using the decoded address, wherein initiating the read operation includes:
      pre-charging, using the plurality of pre-charge signals, a particular global bit line of a plurality of global bit lines coupled to the particular bank;
      generating a reset signal using at least one pre-charge signal of the plurality of pre-charge signals, wherein the reset signal is delayed from the at least one pre-charge signal;
   storing, in a first latch circuit, data based on a voltage level of the particular global bit line using the plurality of pre-charge signals; and
   resetting the first latch circuit using the reset signal.

6. The method of claim 5, wherein generating the reset signal includes performing a logical-NOR operation using the at least one pre-charge signal and another pre-charge signal of the plurality of pre-charge signals.

7. The method of claim 5 further comprising, storing, by a second latch circuit, an output of the first latch circuit using a clock signal.

8. The method of claim 5, further comprising generating the plurality of pre-charge signals using at least a first bank enable signal and a second bank enable signal that are based upon the decoded address.

9. The method of claim 5, wherein pre-charging, using the plurality of pre-charge signals, the particular global bit line includes activating at least one p-channel metal-oxide semiconductor field-effect transistor coupled to the particular global bit line.

10. A system, comprising:
a processor; and
a memory coupled to the processor, wherein the memory includes a plurality of banks, wherein each bank of the plurality of banks includes a plurality of data storage cells, and wherein the memory is configured to:
receive an access operation from the processor;
decode an address included in the access operation to generated a decoded address;
select a particular bank of the plurality of banks using the decoded address;
generate a plurality of pre-charge signals using a plurality of bank enable signals that are based upon the decoded address;
store a data value based upon a voltage level of a global bit line coupled to the particular bank using the plurality of pre-charge signals; and
pre-charge the global bit line using a particular pre-charge signal of the plurality of pre-charge signals.

11. The system of claim 10, wherein the memory includes a plurality of latch circuits, and wherein the memory is further configured to store the data value based upon the voltage level of the global bit line using a particular latch circuit of the plurality of latch circuits.

12. The system of claim 11, wherein the memory is further configured to generate a reset signal using at least one pre-charge signal of the plurality of pre-charge signals, wherein the reset signal is delayed from the at least one pre-charge signal.

13. The system of claim 12, wherein the memory is further configured to reset the particular latch circuit using the reset signal.

14. The system of claim 11, wherein the memory is further configured to store an output of the particular latch circuit using another latch circuit of the plurality of latch circuits based on a clock signal.

15. The system of claim 10, wherein to pre-charge the global bit line, the memory is further configured to activate at least one p-channel metal-oxide semiconductor field-effect transistor coupled to the global bit line.

* * * * *